United States Patent [19]

Inamori et al.

[11] Patent Number: 5,304,873
[45] Date of Patent: Apr. 19, 1994

[54] LOG COMPRESSING CIRCUIT PROVIDING CAPABILITY OF KEEPING CLAMP LEVEL INDEPENDENT OF VARIETY OF AMPLIFICATION FACTOR

[75] Inventors: Masanori Inamori, Tenri; Toshihide Miyake, Nara, both of Japan

[73] Assignee: Sharp Kabushiki Kaisha, Osaka, Japan

[21] Appl. No.: 994,789

[22] Filed: Dec. 22, 1992

[30] Foreign Application Priority Data

Dec. 28, 1991 [JP] Japan .................................. 3-360150

[51] Int. Cl.$^5$ ........................... G06G 7/24; H03D 1/00
[52] U.S. Cl. .................... 307/492; 307/546; 328/145
[58] Field of Search ............... 307/492, 296.6, 546, 307/551, 567; 328/145; 323/313, 315, 316

[56] References Cited

U.S. PATENT DOCUMENTS

| | | | |
|---|---|---|---|
| 4,349,755 | 9/1982 | Bee | 307/492 |
| 4,560,919 | 12/1985 | Ishikawa et al. | 323/316 |
| 4,791,325 | 12/1988 | McGinn | 307/546 |
| 4,843,304 | 6/1989 | Merlo | 323/316 |
| 5,065,053 | 11/1991 | Chan et al. | 307/492 |

*Primary Examiner*—William L. Sikes
*Assistant Examiner*—Toan Tran

[57] ABSTRACT

A log compressing circuit is arranged so that the clamping level is independent of the amplification factor of a first transistor for amplifying input current. The log compressing circuit includes the first transistor for amplifying input current, a compressing diode for log-compressing the amplified current, a clamp voltage generating diode serving as a source for generating a clamping voltage, and a second transistor for clamping the log-compressed voltage if the voltage goes beyond a predetermined clamp voltage. The second transistor has the same form as the first transistor and provides a collector connected to a cathode of the clamp voltage generating diode. The constant current is supplied to the second transistor from a constant current source.

8 Claims, 2 Drawing Sheets

LOG COMPRESSING CIRCUIT PROVIDING CAPABILITY OF KEEPING CLAMP LEVEL INDEPENDENT OF VARIETY OF AMPLIFICATION FACTOR

BACKGROUND OF THE INVENTION

1. Field of the Invention

The present invention relates to a log compressing circuit, such as an operating circuit for measuring a distance, which is arranged to perform log compression about an input signal, and more particularly to a log compressing circuit which serves to clamp an output voltage when performing log compression at a predetermined voltage.

2. Description of the Background Art

The inventors of the present application acknowledge that such a log compressing circuit as applied to a distance measuring circuit for an auto-focus camera has been arranged to clamp the output voltage if it exceeds a predetermined clamp voltage. The electric connecting arrangement of the known log compressing circuit will be described as referring to FIG. 1.

As shown, an input current I80 is guided to a base of a transistor Q91, so that the current I81 amplified by the transistor Q91 may flow through a compressing diode Q92. Hence, the voltage Vbe92 between the terminals of the compressing diode Q92 may be represented as follows, because the compressing diode Q92 is composed of a transistor having its base and collector connected to each other.

$$Vbe92 = kT/q * \ln(I81/Io92) \quad \text{(91st expression)}$$

where Io92 denotes a reverse saturation current between the base and the emitter of the compressing diode Q92. As is obvious from the expression, the current I81 is log-compressed as the voltage Vbe92.

The impedance conversion is performed about this voltage Vbe92 in a transistor Q93 which is an emitter follower. Then, at an output OUT9, the following voltage appears.

$$Out9 = Vcc - (Vbe92 + Vbe93) \quad \text{(92nd expression)}$$

where Vcc is a reference voltage value and Vbe93 denotes a voltage applied between the base and the emitter of the transistor Q93.

On the other hand, transistors Q94 to Q99 and Q90 and constant current I95 to I97 form a clamp circuit. The voltage at the base of the transistor Q96 is fixed at a constant voltage through the effect of a diode Q90 and a transistor Q99 for impedance conversion. As such, the reduction of the input current I80 lowers a voltage between the terminals of the compressing diode Q92. If the base voltage of the transistor Q95 goes beyond the base voltage of the transistor Q96, a collector current I83 of the transistor Q96 is larger than a collector current I82 of the transistor Q95. This results in making the current of I85=I83−I82 flow through the base of the transistor Q94. Hence, the base current of the transistor Q95 and the emitter current of the transistor Q93 are pulled by the emitter current of the transistor Q94, so that the base voltage of the transistor Q95 may be made lower. This feedback operation keeps the base voltage of the transistor Q95 equally balanced with the base voltage of the transistor Q96, thereby clamping the voltage Out9 by the base voltage of the transistor Q96.

The clamp voltage is defined by the currents I86 and I87 flowing through a diode Q90, a transistor Q99 and constant current sources I96 and I97. Assuming that the voltage between the terminals of the diode Q90 is denoted by Vbe90 (the diode Q90 is composed of a transistor having its base and collector connected to each other), Vbe90 can be represented by:

$$Vbe90 = kT/q * \ln(I87/Io90) \quad \text{(93rd expression)}$$

wherein Io90 denotes a reverse saturation current between the base and the emitter of the diode Q90. As such, the base voltage V96 of the transistor Q96 can be represented by:

$$V96 = Vcc - (Vbe90 + Vbe99) \quad \text{(94th expression)}$$

where Vbe99 denotes a voltage between the base and the emitter of the transistor Q99 operated as an emitter follower.

On the other hand, assuming that Ix81 denotes a value of the current I81 given when clamping is ready to start, when the current I81 becomes I81=Ix81, the following equation is established.

$$Vce93 = Vce99$$

where Vce93 denotes a voltage between a collector and an emitter of the transistor Q93 and Vce99 denotes a voltage between a collector and an emitter of the transistor Q99.

By representing the equation by using the 91st to the 94th expressions, the following equations can be established.

$$Vbe92 + Vbe93 = Vbe90 + Vbe99$$

$$kT/q * \ln(Ix81/Io92) + Vbe93 = kT/q * \ln(I87/Io90) + Vbe99$$

Now, assume that each combination of the diodes Q92 and Q90, the transistors Q93 and Q99 and the constant current sources I93 and I96 is arranged of the similarly patterned elements. On the assumption, Io92=Io90 and Vbe93=Vbe99 are established. Hence, Ix81=I87 is established as well.

As such, the clamp level at the current I81 flowing through the diode Q92 is denoted by I87 and the clamp level Ix81 is set as a current value of the constant current value I97.

The clamp level Ix81 in the known arrangement does not depend on the variety of the transistor $h_{FE}$ resulting from the processing difference of each wafer. However, as viewed from the input current I80 side, the current Ix80 can be represented by:

$$Ix80 = Ix81/h_{FE}91$$

where Ix80 denotes a value of the input current flowing when clamping is ready to start and $h_{FE}91$ denotes an amplification factor of the transistor Q91. That is, the difference of the amplification factor of the transistor Q91 resulting from the difference of the process appears as the difference of a clamp level as viewed from the input side. This has been a disadvantage of the known log compressing circuit.

SUMMARY OF THE INVENTION

It is an object of the present invention to provide a log compressing circuit which provides a clamping level as viewed from the input side, independently of the variety of an amplification factor of a transistor for amplifying the input current.

In carrying out the object, a log compressing circuit for log-compressing input current includes a first transistor for amplifying a current input to the circuit; a compressing diode for log-compressing an amplified current into a log-compressed voltage; and a clamp circuit for clamping the log-compressed voltage at a clamp voltage if the log-compressed voltage goes beyond a predetermined clamp voltage. The clamp circuit includes a clamp voltage generating diode serving as a source for generating the clamp voltage, a second transistor having the same form as the first transistor and having a collector connected to a cathode of the clamp voltage generating diode, and a constant current source for feeding constant current to a base of the second transistor.

In operation, the variety of the clamping current of the input current resulting from the variety of the first transistor $h_{FE}$ is allowed to be corrected or compensated by the similar variety of the second transistor $h_{FE}$. The clamping level as viewed from the input side is independent of the variety of the amplification factor of the first transistor for amplifying the input current.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

Further objects and advantages of the present invention will be apparent from the following description of the preferred embodiment of the invention as illustrated in the accompanying drawing, which are given by way of illustration only and thus are not limitative of the present invention, and wherein.

DESCRIPTION OF THE PREFERRED EMBODIMENTS

An embodiment of the invention will be described as referring to FIG. 2 which shows an electric circuit diagram of one embodiment of the invention.

Figure 1:
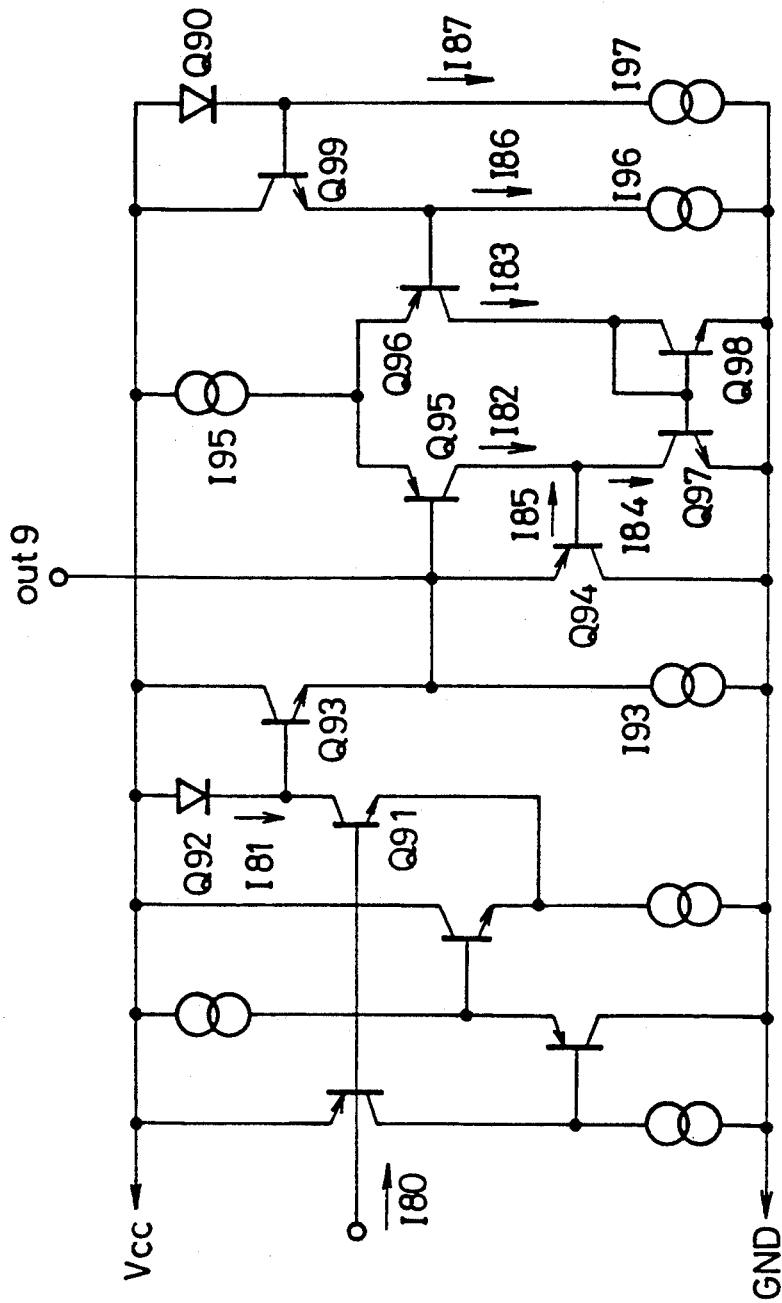
FIG. 1 is a connecting circuit diagram showing an electric connecting arrangement of a conventional log-compressing circuit and FIG. 2 is a diagram showing an electric circuit arrangement of a log compressing circuit according to an embodiment of the invention.
Figure 2:
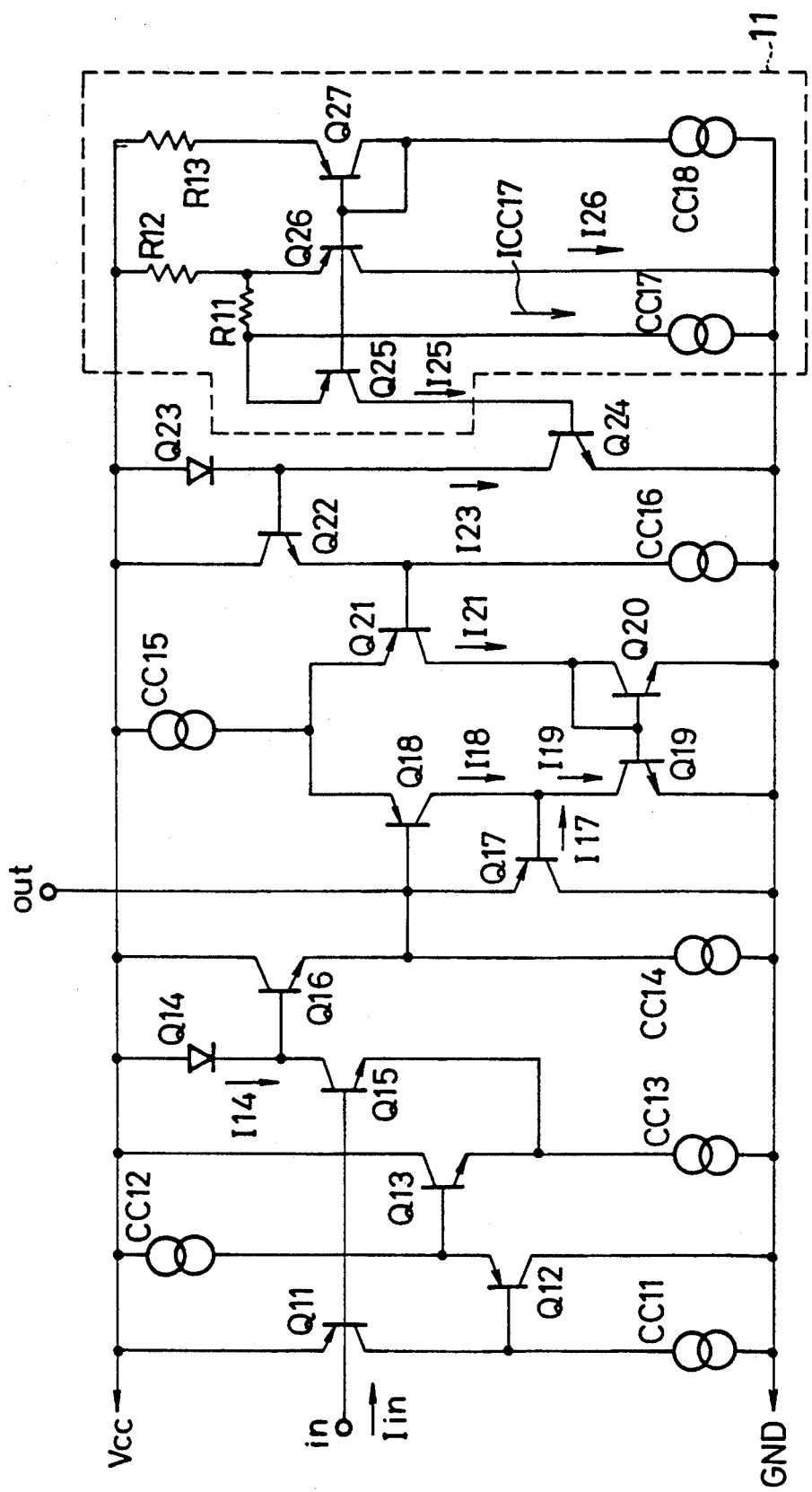

As shown in FIG. 2, a numeral Q14 denotes a compressing diode and a numeral Q23 denotes a clamp voltage generating diode, each of which is formed of a transistor having a base and a collector connected to each other. In the following description, therefore, a terminal corresponding to a cathode of the diode is referred to as an emitter and the other terminal corresponding to an anode of the diode is referred to as a base.

An input terminal in is connected to both of the bases of a transistor Q11 and a first transistor Q15. The emitter of the transistor Q11 is connected to a positive terminal of power source Vcc and the collector of Q11 is connected to the base of the transistor Q12 and is grounded through a constant current source CC11.

The emitter of the transistor Q12 is connected to the base of the transistor Q13 and the positive terminal of power source Vcc through a constant current source CC12. The emitter of the transistor Q13 is grounded through the constant current source CC13, as is the emitter of the first transistor Q15. The transistor Q13 has a collector connected to the positive terminal of power source Vcc.

The collector of the first transistor Q15 is connected to a base of a transistor Q16 and an emitter of a compressing diode Q14. The transistor Q16 has a collector connected to the positive terminal of power source Vcc. The compressing diode Q14 has a base connected to the positive terminal of power source Vcc.

The emitter of the transistor Q16 is connected to an output terminal out, the emitter of the transistor Q17 and the base of the transistor Q18, and is grounded through a constant current source CC14.

The base of the transistor Q17 is connected to the collectors of the transistor Q18 and Q19. The emitter of the transistor Q18 is connected to the positive terminal of power source Vcc through the constant current source CC15 and is connected to an emitter of a transistor Q21. The transistor Q19 has a base connected to a base and a collector of a transistor Q20 and a collector of the transistor Q21. The emitters of the transistors Q19 and Q20 are both grounded.

The base of the transistor Q21 is grounded through the constant current source CC16 and is connected to the emitter of a transistor Q22. The collector of the transistor Q22 is connected to the positive terminal of power source Vcc. The base of the transistor Q22 is connected to an emitter of a clamp voltage generating diode Q23 and a collector of a second transistor Q24. The diode Q23 has a base connected to the positive terminal of power source Vcc.

A numeral Q24 denotes a second transistor having an emitter grounded and a base connected to a collector of a transistor Q25. The emitter of the transistor Q25 is grounded through a constant current source CC17 and is connected to one terminal of a resistor R11. The other terminal of the resistor R11 is connected to one terminal of a resistor R12 and an emitter of a transistor Q26. The other terminal of the resistor R12 is connected to the positive terminal of power source Vcc.

The transistor Q26 has a collector grounded and a base connected to a base and a collector of a transistor Q27 and the base of the transistor Q25 and is grounded through the constant current source CC18. The emitter of the transistor Q27 is connected to one terminal of a resistor R13, the other terminal of which is connected to the positive terminal of power source Vcc.

In the foregoing arrangement, a constant current source 11 is formed of three transistors Q25 to Q27, three resistors R11 to R13 and two constant current sources CC17 to CC18. Further, each pair of the compressing diode Q14 and the clamp voltage generating diode Q23, the transistors Q16 and Q22, the constant current sources CC14 and CC16, and the first transistor Q15 and the second transistor Q24 comprise similarly formed elements.

The description will now be oriented as to how the log compressing circuit according to this embodiment operates.

The three transistors Q11 to Q13 and the three constant current sources CC11 to CC13 form one circuit. This circuit operates as keeping an input voltage constant independently of the current value applied to the input terminal in. This operation for expansion is not essentially relevant to the main theme of the invention and thus is not described herein.

The operation of a main part will now be described.

The change of the base current of the first transistor Q15 is equal to the change of the current Iin flowing through the input terminal in. The current I14 amplified by the first transistor Q15 flows through the compressing diode Q14.

Assuming that a reverse saturation current flowing between the base and the emitter of the compressing diode Q14 is Io14, the voltage Vbe14 between the terminals of the compressing diode Q14 can be represented by the following expression.

$$Vbe14 = kT/q \cdot \ln(I14/Io14) \quad \text{(First Expression)}$$

The current I14 is log-compressed into the voltage Vbe14. The impedance conversion is performed about the voltage Vbe14 in the transistor Q16 serving as an emitter follower. Then, the resulting voltage appears at the output terminal out. The voltage can be represented by the following expression.

$$Vout = Vcc - (Vbe14 + Vbe16) \quad \text{(Second Expression)}$$

where Vcc is used as a reference voltage and Vbe16 denotes a voltage between the base and the emitter of the transistor Q16.

On the other hand, the transistors Q17 to Q24, the constant current source CC16 and the constant current source 11 form a clamp circuit. In the clamp circuit, the base voltage of the transistor Q21 is fixed at a constant voltage through the effect of the clamp voltage generating diode Q23 and the transistor Q22 for impedance conversion.

Therefore, the reduction of the input current Iin results in lowering the voltage Vbe14 between the terminals of the compressing diode Q14. In a case that the base voltage of the transistor Q18 goes beyond the base voltage of the transistor Q21, the collector current I21 of the transistor W21 is made larger than the collector current I18 of the transistor Q18.

As a result, the current represented by I17=I21−I18 flows through the base of the transistor Q17. The base current of the transistor Q18 and the emitter current of the transistor Q16 are pulled by the emitter current of the transistor Q17. This results in lowering the base voltage of the transistor Q18. This feedback operation keeps the base voltage of the transistor Q18 equally balanced with the base voltage of the transistor Q21. That is, the voltage Vout of the output terminal out is clamped by the base voltage of the transistor Q21.

The clamp voltage is defined by the clamp voltage generating diode Q23, the transistor Q22, the constant current source CC16, and the second transistor Q24 and the constant current source 11. Hence, assuming that the voltage between the terminals of the clamp voltage generating diode Q23 is Vbe23, the voltage Vbe23 is represented by the following expression.

$$Vbe14 = kT/q \cdot \ln(I23/Io23) \quad \text{(Third Expression)}$$

where Io23 denotes a reverse saturation current between the base and the emitter of the clamp voltage generating diode Q23.

As such, assuming that the voltage between the base and the emitter of the transistor Q22 serving as an emitter follower, the base voltage Vb21 of the transistor Q21 is represented by the following expression.

$$Vb21 = Vcc - (Vbe23 + Vbe22) \quad \text{(Fourth Expression)}$$

Now, assume that Ix14 denotes a value of the current I14 appearing when the clamping is ready to start. When the current I14 becomes I14=Ix14, Vce16=−Vce22 is established, in which Vce16 denotes a voltage between the collector and the emitter of the transistor Q16 and Vce22 denotes a voltage between the collector and the emitter of the transistor Q22.

By representing the equation by using the first to the fourth expressions, the following equations are established.

$$Vbe14 + Vbe16 = Vbe23 + Vbe22$$

That is, $$kT/q \cdot \ln(Ix14/Io14) + Vbe16 = kT/q \cdot \ln(I23/Io23) + Vbe22$$

On the other hand, each pair of the compressing diode Q14 and the clamp voltage generating diode Q23, the transistors Q16 and Q22, and the constant current sources CC14 and CC16 are arranged of the similarly formed elements. Hence, the following expressions are established.

$$Io14 = I23$$

$$Vbe16 = Vbe22$$

Thus, $$Ix14 = I23 \quad \text{(Fifth expression)}$$

This means that the clamp level of the current I14 flowing through the compressing diode Q14 is represented by I23. The clamp level Ix14 is set as a current I23 flowing through the collector of the second transistor Q24.

Next, description will now be oriented to how the constant current source 11 operates. The constant current source 11 serves to supply a constant base current to the second transistor Q24 using the current I23 as its collector current.

The resistor R13, the transistor Q27 and the constant current source CC18 bring about a bias voltage for a constant current source between the terminals of the resistor R13. Since the constant current source CC17 flows current through the resistor R11, the following equation is established.

$$Vr11 = r11 \cdot ICC17$$

wherein ICC17 denotes a current value of the constant current source CC17, r11 denotes a value of the resistor R11, and Vr11 denotes a voltage between the terminals of the resistor R11.

Hence, the base-emitter voltage Vbe25 of the transistor Q25 is lower than the base-emitter voltage Vbe26 of the transistor Q26 by the voltage Vr11. It indicates that the relation between the collector current I25 of the transistor Q25 and the collector current I26 of the transistor Q26 is represented by the following expression.

$$I25 = ((kT/q)/Vr11)*I26$$

In a case that the resistor R11 and the current value of the constant current source CC17 are set so that the value of the voltage Vr11 is kept 120 mV, the collector current I25 of the transistor Q25 is set as a minute current which is 1/10 as large as the current I26.

That is, the current I23 is set to a current value of a constant current source CC17 or CC18 which serves to flow the same order of current as the current I23 ($h_{FE}$ of the second transistor Q24 has a value near 100).

In a case that the amplification factor of the second transistor Q24 is $h_{FE}24$, the second transistor Q24 having a base current output from the constant current source 11, the current I23 flowing through the clamping voltage generating diode Q23 is represented by the following expression.

$$I23 = I25 * h_{FE}24 \qquad \text{(Sixth Expression)}$$

On the other hand, for the compressing diode Q14, the current I14 flowing through the diode Q14 is independent of the variety of $h_{FE}$ of the transistor resulting from the variety of the manufacturing process of each wafer. However, if the current Ix14 is viewed from the input current Iin, the voltage Ixin appearing when the clamping is ready to start is represented by the following expression.

$$Ixin = Ix14/h_{FE}17 \qquad \text{(Seventh Expression)}$$

where $h_{FE}15$ denotes an amplification factor of the first transistor Q15.

Thus, from the fifth to the seventh expressions, the following expression is established.

$$I14 * h_{FE}15 = I25 * h_{FE}24 \qquad \text{(Eighth Expression)}$$

By substituting the following expression of $h_{FE}15 = h_{FE}24$ for the eighth expression, the expression of I14 = I25 is established. The expression of $h_{FE}15 = h_{FE}24$ indicates the first transistor Q15 is similar in form and thereby variety of an amplification factor of the second transistor Q24.

Hence, the clamp current Ix14 converted into the current Iin flowing through the input terminal in is represented as follows.

$$Ix14 = I25$$

As such, the clamp current Ix14 is independent of the variety of the amplification factor of the first transistor Q15 resulting from the variable manufacturing processes. It is set only by the output current I25 of the constant current source 11.

Many widely different embodiments of the present invention may be constructed without departing from the spirit and scope of the present invention. It should be understood that the present invention is not limited to the specific embodiments described in the specification, except as defined in the appended claims.

What is claimed is:

1. A log compressing circuit for log-compressing input current, comprising:
   a first transistor, for amplifying a current input to the log compressing circuit, having a base connected to an input terminal of the log compressing circuit;
   a compressing diode for log-compressing the amplified current into a log-compressed voltage; and
   a clamp circuit for clamping the log-compressed voltage at a clamp voltage if the log-compressed voltage exceeds a predetermined clamp voltage, said clamp circuit including
   a clamp voltage generating diode serving as a source for generating the clamp voltage,
   a second transistor having the same form as said first transistor and having a collector connected to a cathode of said clamp voltage generating diode, and
   a constant current source for feeding constant current to a base of said second transistor.

2. The log compressing circuit as claimed in claim 1, wherein said first transistor has a collector connected to a cathode of said compressing diode and to a base of a third transistor for impedance conversion.

3. The log compressing circuit as claimed in claim 2, wherein an anode of said compressing diode and a collector of said third transistor are connected to a power source, and wherein an emitter of said third transistor is grounded through a second current source.

4. The log compressing circuit as claimed in claim 3, wherein an emitter of said second transistor is connected to a ground line, and wherein said clamp circuit further comprises a fourth transistor for impedance conversion having a base connected to a cathode of said clamp voltage generating diode, a collector connected to said power source and an emitter grounded through a third current source.

5. The log compressing circuit as claimed in claim 4, wherein said clamp circuit further includes a feedback circuit comprising:
   a fifth transistor, a sixth transistor and a seventh transistor, emitters of said fifth and sixth transistors being connected to each other, a collector of said fifth transistor being connected to a base of said seventh transistor, the log-compressed voltage being supplied to a base of said fifth transistor and to an emitter of said seventh transistor, and the clamp voltage being supplied to a base of said sixth transistor through said fourth transistor.

6. The log compressing circuit as claimed in claim 5, wherein said compressing diode has the same form as said clamp voltage generating diode, said third transistor has the same form as said fourth transistor, and said second current source has the same form as said third current source.

7. The log compressing circuit as claimed in claim 1, wherein each of said compressing diode and said clamp voltage generating diode is respectively comprised of a transistor having a base and a collector connected to each other.

8. The log compressing circuit as claimed in claim 1, wherein said constant current source comprising:

a third transistor having an emitter grounded through a second current source and connected to a power source through first and second resistors;

a fourth transistor having an emitter connected to said power source through said second resistor and a collector grounded; and a fifth transistor having an emitter connected to said power source through a third resistor and a collector grounded through a third current source and connected to a base thereof, each of bases of said third, fourth and fifth transistor are connected to the two others.

* * * * *